US009658953B2

(12) United States Patent
Sheffler et al.

(10) Patent No.: US 9,658,953 B2
(45) Date of Patent: *May 23, 2017

(54) SINGLE COMMAND, MULTIPLE COLUMN-OPERATION MEMORY DEVICE

(71) Applicant: Rambus Inc., Sunnyvale, CA (US)

(72) Inventors: Thomas Sheffler, San Francisco, CA (US); Lawrence Lai, San Jose, CA (US); Liang Peng, San Jose, CA (US); Bohuslav Rychlik, Morrisville, NC (US)

(73) Assignee: Rambus Inc., Sunnyvale, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 14/637,369

(22) Filed: Mar. 3, 2015

(65) Prior Publication Data

US 2015/0178187 A1    Jun. 25, 2015

Related U.S. Application Data

(63) Continuation of application No. 13/383,205, filed as application No. PCT/US2010/039095 on Jun. 17, 2010.

(Continued)

(51) Int. Cl.
*G06F 12/00*    (2006.01)
*G06F 13/00*    (2006.01)
(Continued)

(52) U.S. Cl.
CPC .......... *G06F 12/023* (2013.01); *G11C 7/1006* (2013.01); *G11C 7/1039* (2013.01);
(Continued)

(58) Field of Classification Search
CPC ........ G06F 3/06; G06F 12/02; G06F 12/0223; G06F 12/023; G06F 12/0238;
(Continued)

(56) References Cited

U.S. PATENT DOCUMENTS 4,914,570 A    4/1990  Peacock
5,297,271 A *  3/1994  Bhayani ................. G09G 5/393
                                                    345/534

(Continued)

FOREIGN PATENT DOCUMENTS

EP    1324190 A2    7/2003
JP    03-246741 A   11/1991
(Continued)

OTHER PUBLICATIONS

A Study of Leveraging Memory Level Parallelism for DRAM System on Multi-core/Many-Core Architecture; Chen et al; 12th IEEE International Conference on Trust, Security and Privacy in Computing and Communications ; Jul. 16-18, 2013; pp. 1206-1215 (10 pages).*

(Continued)

*Primary Examiner* — Daniel C Chappell
(74) *Attorney, Agent, or Firm* — Charles Shemwell

(57) ABSTRACT

A memory access command, column address and plurality of write data values are received within an integrated-circuit memory chip via external signaling links. In response to the memory access command, the integrated-circuit memory chip (i) decodes the column address to select address-specified sense amplifiers from among a plurality of sense amplifiers that constitute a sense amplifier bank, (ii) reads first data, constituted by a plurality of read data values, out of the address-specified sense amplifiers, and (iii) overwrites the first data within the address-specified sense amplifiers with second data constituted by one or more of the write data values and by one or more of the read data values.

21 Claims, 6 Drawing Sheets

Related U.S. Application Data

(60) Provisional application No. 61/235,564, filed on Aug. 20, 2009.

(51) Int. Cl.
*G06F 13/28* (2006.01)
*G06F 12/02* (2006.01)
*G11C 7/22* (2006.01)
*G11C 8/10* (2006.01)
*G11C 7/10* (2006.01)

(52) U.S. Cl.
CPC .............. *G11C 7/22* (2013.01); *G11C 8/10* (2013.01); *G06F 2212/2024* (2013.01); *G11C 2207/107* (2013.01)

(58) Field of Classification Search
CPC .. G06F 12/0246; G06F 12/0284; G06F 12/06; G06F 2212/20; G06F 2212/202; G06F 2212/2022; G06F 2212/2024; G11C 5/00; G11C 5/066; G11C 7/06; G11C 7/062; G11C 7/065; G11C 7/067; G11C 7/08; G11C 7/10; G11C 7/1006; G11C 7/1009; G11C 7/1012; G11C 7/1015; G11C 7/1018; G11C 7/1021; G11C 7/1024; G11C 7/1027; G11C 7/103; G11C 7/1033; G11C 7/1036; G11C 7/1039; G11C 7/1042; G11C 7/1045; G11C 7/1048; G11C 7/1051; G11C 7/1054; G11C 7/1057; G11C 7/106; G11C 7/1063; G11C 7/1066; G11C 7/1069; G11C 7/1072; G11C 7/1075; G11C 7/1078; G11C 7/1081; G11C 7/1084; G11C 7/1087; G11C 7/109; G11C 7/1093; G11C 7/1096; G11C 7/12; G11C 7/14; G11C 7/16; G11C 7/18; G11C 7/20; G11C 7/22; G11C 7/222; G11C 8/00; G11C 8/06; G11C 8/08; G11C 8/10; G11C 8/12; G11C 8/14; G11C 8/16; G11C 8/18; G11C 11/00; G11C 11/005; G11C 11/21; G11C 11/22; G11C 11/225; G11C 11/2255; G11C 11/2257; G11C 11/2259; G11C 11/2273; G11C 11/2275; G11C 11/2293; G11C 11/24; G11C 11/34; G11C 11/35; G11C 11/40; G11C 11/406; G11C 11/40603; G11C 11/40611; G11C 11/40615; G11C 11/40618; G11C 11/40622; G11C 11/4063; G11C 11/4067; G11C 11/407; G11C 11/4072; G11C 11/4074; G11C 11/4076; G11C 11/408; G11C 11/4082; G11C 11/4085; G11C 11/4087; G11C 11/409; G11C 11/4091; G11C 11/4093; G11C 11/4096; G11C 11/4097; G11C 11/4099; G11C 2207/00; G11C 2207/002; G11C 2207/005; G11C 2207/007; G11C 2207/06; G11C 2207/061; G11C 2207/063; G11C 2207/065; G11C 2207/066; G11C 2207/068; G11C 2207/10; G11C 2207/101; G11C 2207/102; G11C 2207/104; G11C 2207/105; G11C 2207/107; G11C 2207/108; G11C 2207/12; G11C 2207/22; G11C 2207/2209; G11C 2207/2218; G11C 2207/2227; G11C 2207/2236; G11C 2207/2245; G11C 2207/2254; G11C 2207/2263; G11C 2207/2272; G11C 2207/2281; G11C 2207/229

See application file for complete search history.

(56) References Cited

U.S. PATENT DOCUMENTS

| | | | |
|---|---|---|---|
| 5,430,860 A * | 7/1995 | Capps, Jr. ............... | G06F 13/14 710/200 |
| 5,459,842 A * | 10/1995 | Begun ................. | G06F 13/1631 710/68 |
| 5,729,160 A | 3/1998 | Allan | |
| 5,974,514 A | 10/1999 | Andrewartha et al. | |
| 6,327,642 B1 * | 12/2001 | Lee ........................ | G06F 12/084 710/38 |
| 6,366,530 B1 | 4/2002 | Sluiter et al. | |
| 6,381,190 B1 * | 4/2002 | Shinkai ................ | G11C 7/1051 365/189.14 |
| 6,397,235 B1 * | 5/2002 | Van Eijndhoven . | G06F 9/30014 708/401 |
| 6,473,828 B1 * | 10/2002 | Matsui ................ | G06F 12/0893 365/154 |
| 6,671,836 B1 | 12/2003 | Lai et al. | |
| 6,751,160 B1 | 6/2004 | Murata | |
| 6,751,712 B2 * | 6/2004 | Iizuka ...................... | G06F 13/16 711/154 |
| 6,973,551 B1 | 12/2005 | Walton | |
| 6,993,770 B1 | 1/2006 | Detlefs et al. | |
| 7,280,428 B2 * | 10/2007 | Ware ........................ | G11C 8/12 365/189.04 |
| 7,293,143 B1 | 11/2007 | Shavit et al. | |
| 7,421,544 B1 | 9/2008 | Wright et al. | |
| 7,424,477 B1 | 9/2008 | Martin et al. | |
| 7,500,043 B2 * | 3/2009 | Wood .................. | G06F 15/8007 370/464 |
| 7,583,550 B2 * | 9/2009 | Ohgami ............... | G11C 11/4091 365/205 |
| 7,689,788 B2 | 3/2010 | Moir et al. | |
| 8,095,741 B2 * | 1/2012 | Heller, Jr. ............. | G06F 9/3004 711/147 |
| 8,250,320 B1 * | 8/2012 | Bar-El ................. | G06F 13/4243 711/155 |
| 2001/0000655 A1 | 5/2001 | Morishita | |
| 2001/0047361 A1 | 11/2001 | Martin et al. | |
| 2001/0049764 A1 | 12/2001 | Lu et al. | |
| 2002/0174283 A1 | 11/2002 | Lin | |
| 2003/0120880 A1 * | 6/2003 | Banno ................. | G06F 9/30018 711/155 |
| 2003/0172241 A1 | 9/2003 | Shirota | |
| 2003/0174572 A1 | 9/2003 | Moir et al. | |
| 2003/0182465 A1 | 9/2003 | Moir et al. | |
| 2004/0006665 A1 | 1/2004 | Moss | |
| 2004/0015642 A1 | 1/2004 | Moir et al. | |
| 2004/0034673 A1 | 2/2004 | Moir et al. | |
| 2005/0086446 A1 | 4/2005 | McKenney et al. | |
| 2006/0067146 A1 * | 3/2006 | Woo ........................ | G11C 7/065 365/206 |
| 2006/0072366 A1 * | 4/2006 | Ware ........................ | G11C 8/12 365/230.06 |
| 2006/0161737 A1 | 7/2006 | Martin et al. | |
| 2007/0028056 A1 | 2/2007 | Harris | |
| 2007/0050559 A1 | 3/2007 | Alsup | |
| 2007/0050563 A1 | 3/2007 | Alsup | |
| 2007/0136289 A1 | 6/2007 | Adl-Tabatabai et al. | |
| 2007/0143741 A1 | 6/2007 | Harris | |
| 2007/0157202 A1 | 7/2007 | Moir et al. | |
| 2007/0186056 A1 | 8/2007 | Saha et al. | |
| 2007/0198519 A1 | 8/2007 | Dice et al. | |
| 2007/0198781 A1 | 8/2007 | Dice et al. | |
| 2007/0198978 A1 | 8/2007 | Dice et al. | |
| 2007/0198979 A1 | 8/2007 | Dice et al. | |
| 2007/0288587 A1 | 12/2007 | Aguilera et al. | |
| 2008/0021934 A1 | 1/2008 | Hudson et al. | |
| 2008/0022054 A1 | 1/2008 | Hertzberg et al. | |
| 2008/0120455 A1 | 5/2008 | Larus et al. | |

(56) References Cited

U.S. PATENT DOCUMENTS

| | | | |
|---|---|---|---|
| 2008/0183984 A1* | 7/2008 | Beucler | G11C 7/1006 |
| | | | 711/155 |
| 2008/0301378 A1 | 12/2008 | Carrie | |
| 2008/0320459 A1 | 12/2008 | Morris | |
| 2009/0119667 A1 | 5/2009 | Hou et al. | |
| 2009/0165006 A1 | 6/2009 | Ceze et al. | |
| 2009/0172317 A1 | 7/2009 | Saha et al. | |
| 2009/0183159 A1 | 7/2009 | Michael et al. | |
| 2009/0285048 A1* | 11/2009 | Fujisawa | G11C 7/1072 |
| | | | 365/233.1 |
| 2011/0016278 A1* | 1/2011 | Ware | G06F 13/1684 |
| | | | 711/148 |
| 2011/0153932 A1* | 6/2011 | Ware | G11C 8/12 |
| | | | 711/114 |

FOREIGN PATENT DOCUMENTS

| | | | |
|---|---|---|---|
| JP | 7-146813 | A1 | 6/1995 |
| JP | 8-129376 | A | 5/1996 |
| JP | 9-138761 | A | 5/1997 |
| JP | 10-207771 | A | 8/1998 |

OTHER PUBLICATIONS

High Performance Dynamic Random Access Memories; Sharma, Ashok K.; Advanced Semiconductor Memories:Architectures, Designs, and Applications; Wiley-IEEE Press; 2003; pp. 129-235 (107 pages).*
ProPRAM: Exploiting the transparent logic resources in Non-Volatile Memory for Near Data Computing; Wang et al; 52nd ACM/EDAC/IEEE Design Automation Conference; Jun. 8-12, 2015 (6 pages).*
"Definition: Concurrently," The Free Dictionary by FARLEX, retrieved from http://www.thefreedictionary.com/concurrently on Jan. 31, 2014. 1 page.
"Definition: Core," Merriam-Webster Dictionary, retrieved from http://www.merriam-webster.com/dictionary/core on May 15, 2014. 1 page.
"Definition: Memory," Free Online Dictionary of Computing (FOLDOC), Last Updated May 25, 1996, retrieved from http://foldoc.org/memory on May 15, 2014. 1 page.
"Definition: Pipeline," Sep. 3, 2001, retrieved from https://web.archive.org/web/20010903095837/http://www.cp.eng.chula.ac.th/~piak/teaching/ca/pipe.htm on Jan. 31, 2014. 4 pages.
Deering et al., "FBRAM: A New Form of Memory Optimized for 3D Graphics," Computer Graphics Proceedings, Annual Conference Series, 1994, SIGGRAPH 94, Orlando, Florida, Jul. 24-29, 1994. 7 pages.
EP Extended Search Report dated Mar. 5, 2014 in EP Application No. 10810321.9. 7 pages.
EP Office Action dated Mar. 21, 2014 in EP Application No. 10810321.9. 1 page.
EP Response dated Sep. 15, 2014 in EP Application No. 10810321.9, Includes New Claims and New Description Pages (Highlighted and Clear Copies). 24 pages.
French, Ted, "Comparison Operators," Dec. 1, 2006, retrieved from https://web.archive.org/web/20061201102741/http://spreadsheets.about.com/od/excelfunctions/ss/if_function_sbs_5.htm on Feb. 1, 2014. 1 page.
Herlihy et al., "Transactional Memory: Architectural Support for Lock-Free Data Structures," Proceedings of the 20th Annual International Symposium on Computer Architecture, May 16-19, 1993, pp. 289-300. 12 pages.
Hidaka et al., "The Cache DRAM Architecture: A DRAM with an On-Chip Cache Memory," IEEE Micro, Apr. 1990. 12 pages.
IBM, "Applications Note: Understanding DRAM Operations," Dec. 1996, retrieved from http://www.ece.cmu.edu/~ece548/localcpy/dramop.pdf on Jan. 31, 2014. 10 pages.
International Preliminary Report on Patentability (Chapter I) dated Mar. 1, 2012 re International Application No. PCT/US10/039096. 6 pages.
International Search Report and Written Opinion dated Aug. 30, 2010 in International Application No. PCT/US2010/039095. 9 pages.
JP Office Action dated Apr. 2, 2014 in JP Application No. 2012-525545. 2 pages.
Konecny, Petr, "Introducing the Cray XMT," http://www.nccs.gov/wp-content/uploads/2007/08/konecny_paper.pdf, Cray Inc., May 5, 2007. 5 pages.
Mitsubishi Electronic Device Group, "4MCDRAM Internal Block Diagram and 3D RAM Architecture," 1994. 2 pages.
NVIDIA, "GeForce 8800 & NVIDIA CUDA, A New Architecture for Computing on the GPU," NVIDIA Corporation 2006, http://developer.nvidia.com/CUDA. 29 pages.
Rouse, Margaret, "Definition: Dynamic Random Access Memory (DRAM)," Sep. 2005, retrieved from http://searchstorage.techtarget.com/definition/DRAM on May 15, 2014. 1 page.
Rouse, Margaret, "Definition: Flash Memory," Sep. 2005, retrieved from http://searchstorage.techtarget.com/definition/flash-memory on May 15, 2014. 1 page.
Rouse, Margaret, "Definition: Integrated Circuit (IC)," WhatIs.com, Sep. 2005, retrieved from http://whatis.techtarget.com/definition/integrated-circuit-IC on Feb. 3, 2014. 1 page.
Wang et al., "Code Generation and Optimization for Transactional Memory Constructs in an Unmanaged Language," International Symposium on Code Generation and Optimization (CGO'07), IEEE, 2007. 12 pages.
Godse et al., "Computer Organisation and Architecture," System Buses, 2006, ISBN: 9789350996348, retrieved Apr. 20, 2015 from https://books.google.com, pp. 30, 58-59. 3 pages.
JP Office Action With Mail Date of Jun. 17, 2016 for JP Appln. No. 2015-103118. 5 Pages. (With Translation).

* cited by examiner

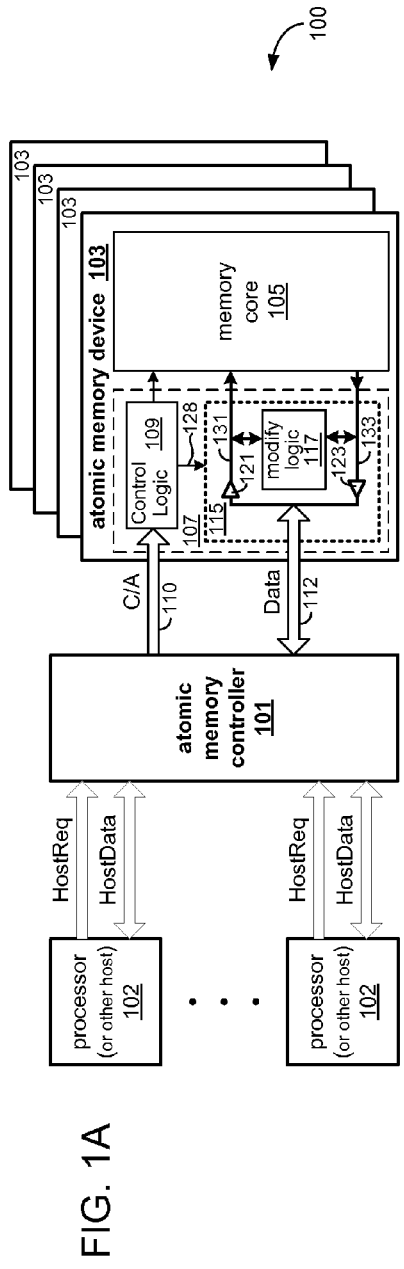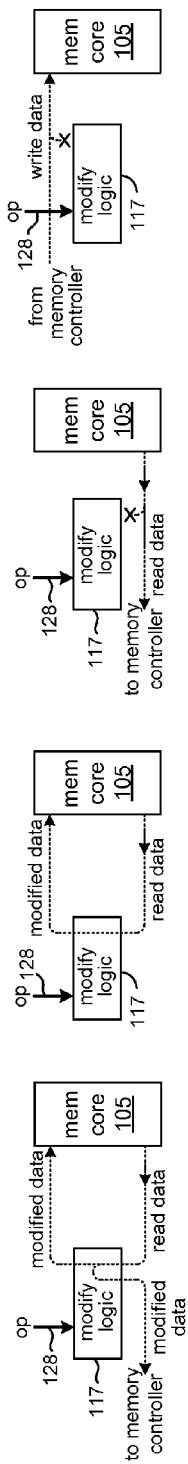

| Operation | Enabled Modify Unit | Rd Data Out Sel | Wr Data Out Sel | |
|---|---|---|---|---|
| read | N/A | read data | N/A | simplex operations |
| write | N/A | N/A | write data | |
| read / increment | unary modify unit | read data | modified data | unary operations |
| increment / read | unary modify unit | modified data | modified data | |
| read / complement | unary modify unit | read data | modified data | |
| complement / read | unary modify unit | modified data | modified data | |
| ... | ... | ... | ... | |
| read / add-offset | binary modify unit (reg-op) | read data | modified data | binary operations using register-sourced operands |
| add-offset / read | binary modify unit (reg-op) | modified data | modified data | |
| read / subtract-offset | binary modify unit (reg-op) | read data | modified data | |
| subtract-offset / read | binary modify unit (reg-op) | modified data | modified data | |
| ... | ... | ... | ... | |
| swap | N/A | read data | swap data | binary operations using host-supplied operands |
| compare-and-swap | binary modify unit (ext-op) | read/swap data | read/swap data | |
| read / add-var | binary modify unit (ext-op) | read data | modified data | |
| add-var / read | binary modify unit (ext-op) | modified data | modified data | |
| ... | ... | ... | ... | | duplex operations (atomic)

SINGLE COMMAND, MULTIPLE COLUMN-OPERATION MEMORY DEVICE

CROSS REFERENCE TO RELATED APPLICATIONS

This application is a continuation of U.S. patent application Ser. No. 13/383,205 filed Jan. 9, 2012, which is a 35 U.S.C. §371 U.S. National Stage of International Patent Application No. PCT/US2010/039095 filed Jun. 17, 2010, which claims priority to U.S. Provisional Patent Application No. 61/235,564, filed Aug. 20, 2009. Each of the foregoing patent applications is hereby incorporated by reference.

TECHNICAL FIELD

The present invention relates generally to the field of data processing, and more particularly to data storage and manipulation within a data processing system.

BACKGROUND

The ever-increasing gap between processor performance and memory bandwidth is reflected in the growing timing penalty incurred when a processor must fetch data from operating memory. While processor-stalls (awaiting data retrieval) and architectural remedies (e.g., cache memories) are costly enough in single-processor systems, such costs tend to be multiplied in multi-processor systems (including multi-core processors), particularly where multiple processors or processor cores share storage locations (e.g., memory). In that case, modification of the shared data by one of the processors generally requires coherency control—interprocessor communication or other high-level coordination such as "locks" or "semaphores" to exclude the other processors from accessing the potentially-stale shared data while the data-modifying processor carries out the multiple steps required to fetch the shared data from the operating memory, modify the data, and then write the modified data back to the operating memory. In general, any of the excluded processors that requires access to the shared data must await notification that the exclusive access is complete.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A illustrates an embodiment of a data processing system capable of carrying out access-protected data modification operations, referred to herein as "atomic" memory operations;

FIGS. 1B-1F illustrate the flow of data in a number atomic memory operations supported by the atomic memory device and atomic memory controller of FIG. 1A;

FIGS. 1G and 1H illustrate the flow of data in a number simplex memory operations supported by the atomic memory device and atomic memory controller of FIG. 1A;

FIG. 4 illustrates a table of operations that may be initiated and controlled by the modify controller of FIG. 3;

DETAILED DESCRIPTION

Figure 2:
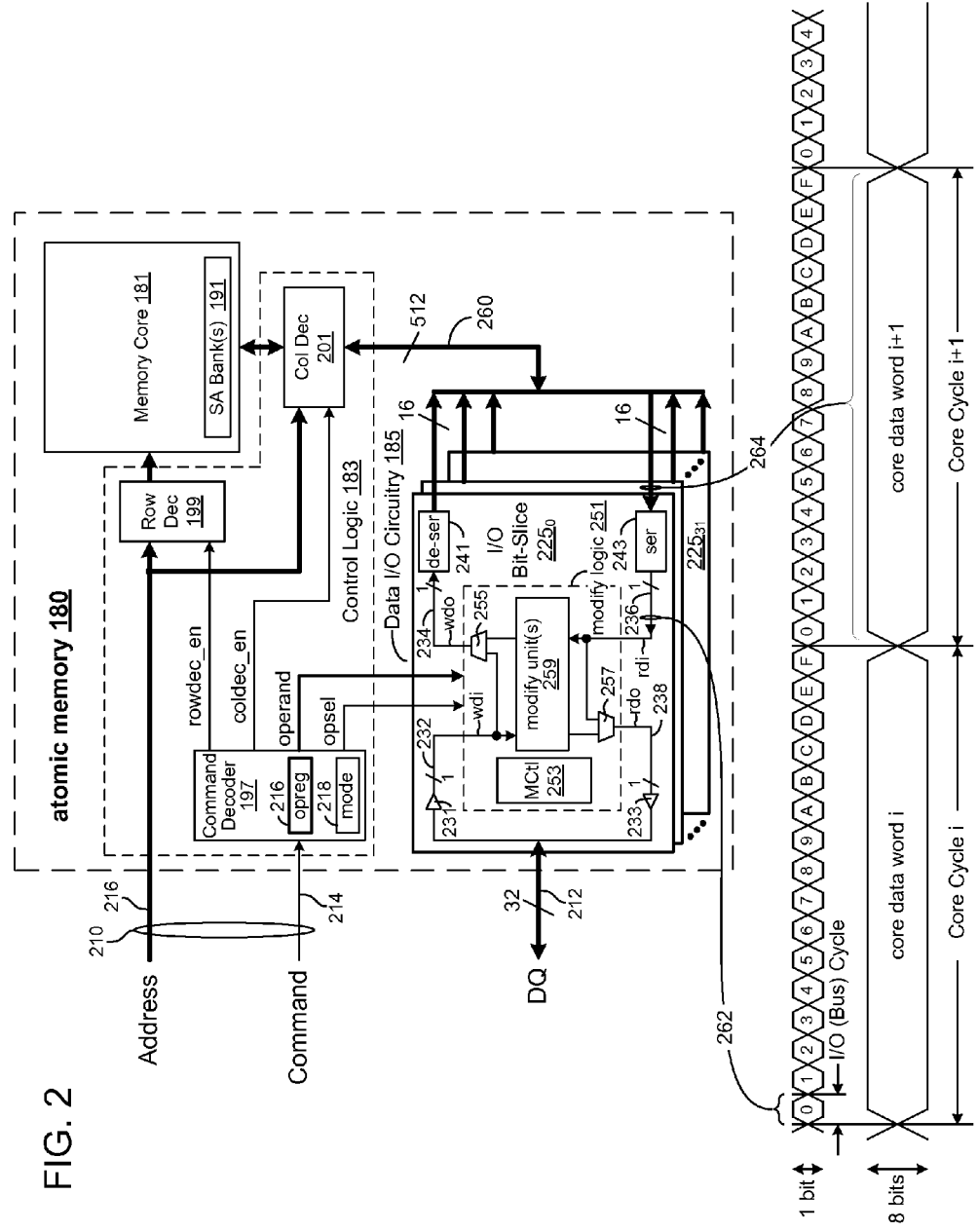
FIG. 2 illustrates an embodiment of an atomic memory device in greater detail.

Memory devices having circuitry to perform data modification operations within the time interval generally required for data access are disclosed in various embodiments. In general, by hiding the data modification operation under or within the memory access time, exclusive access to the data is established by the memory access processes within the memory device itself, thus obviating costly and inefficient exclusivity control mechanisms within the processor(s), memory controller or other upstream circuitry. In several single integrated circuit embodiments presented below, an input-output pipeline of an integrated circuit memory device includes capability to perform multi-step operations and to write data back into the same or different memory cells; because these operations are performed by the input-output pipeline (which generally can only be used by one requestor at a time), a lock can be effectively established without using complicated software mechanisms or multi-processor communications.

A hypothetical illustration is presented with an example of two users, each having a separate workstation and desiring to update a shared financial account database having an entry of $100. Each user's workstation might read the entry in-question ($100), and each user might desire to update the account to add different increments (e.g., to add $20 in the case of the first user, and to add $50 in the case of the second user). The use of software locks in this situation would imply unavailability of the entry or of related processing to one user until the other user is finished; the failure to use locks might imply that the second user's access may read a stale entry ($100) and then overwrite that stale entry with an update (e.g., $150) of stale info, resulting in an incorrect entry (e.g., $150 overwriting the first user's entry of $120 when the correct value should be $170).

FIG. 1A illustrates an embodiment of a data processing system 100 capable of carrying out access-protected data modification operations—that is, data modification operations that are carried out concurrently or coextensively with a memory access operation and thus protected from undesired intervening access by timing restrictions imposed by the memory access itself. Such compound memory operations (i.e., involving data retrieval from one or more memory cores as well as logical, arithmetic, exchange or other operations with respect to the retrieved data) are referred to herein generally as "atomic" operations as they are indivisible from the standpoint of competing memory requestors. Accordingly, as the atomic character of such compound operations is enforced (effected) by circuitry within individual memory devices that populate the memory subsystem, and issuance of specialized "atomic" memory access commands (or requests or instructions) by a memory controller, such memory devices are referred to herein as "atomic" memory devices and the memory controller as an "atomic" memory controller. Thus, the memory subsystem of FIG. 1A includes an atomic memory controller 101 that responds to memory access requests (issued via a host request path, "HostReq") from one or more processors 102 or other host devices running one or more threads; each "atomic operation" is effected by issuing corresponding command and address information to one or more atomic memory devices 103 via command/address path 110 ("C/A"). In the case of a host-write request, write data is output from the host processor 102 to the atomic memory controller 101 via a host data path ("HostData") and then from the atomic memory controller 101 to the atomic memory devices 103 via memory data path 112 ("Data"). Conversely, in the case of a host-read request, read data is output from one or more of the atomic memory devices 103 to the atomic memory controller 101 via the memory data path 112, and then from the atomic memory controller 101 to the requesting host 102 via the corresponding host data path.

With regard to the memory subsystem topology, any number of atomic memory devices 103 may be coupled to the atomic memory controller 101 in any combination of point-to-point and multi-drop signaling paths. In one embodiment, for example, the atomic memory devices 103 are organized into one or more memory ranks (i.e., selected as a unit via one or more chip-select lines or other selection mechanisms) with each atomic memory device 103 of the memory rank being coupled to the atomic memory controller 101 via a common command/address path 110 and via respective (dedicated-per-memory-device) memory data paths 110. By this arrangement, the memory devices of a given rank may be selected as a unit (e.g., via a shared chip-select line or other device selection mechanism) to receive the same memory access command and memory address, and to respond to the common command/address by receiving or outputting respective portions of the overall data word (via dedicated memory data paths) being transferred between the rank of atomic memory devices 103 and the atomic memory controller 101. In alternative embodiments, separate command/address paths 110 may be provided to enable selection of atomic memory devices either as a rank or individually (or in sub-groups within a rank), and/or multiple atomic memory devices 103 may be coupled to a memory data path 110 (or to each memory data path 110 in system 100) in a multi-drop arrangement.

Still referring to FIG. 1A, each of the atomic memory devices 103 includes core access circuitry 107 to enable access to a memory core 105 formed by one or more arrays of storage cells. The storage arrays of the memory core 105 may be populated by virtually any type of storage cells including for example and without limitation, volatile or non-volatile memory; for example, the storage cells may include static random access memory (static RAM or SRAM) cells, dynamic RAM (DRAM) cells, charge-trapping cells such NAND or NOR flash memory cells, phase-change memory cells, ferro-magnetic memory cells or any other storage cell technology that permits storage and retrieval of digital data. Further, the memory core 105 may include various signal lines and circuitry to enable access to the underlying storage cells such as, for example and without limitation, word lines to enable access to address-selected rows of storage cells, bit lines to convey data signals between word-line-selected storage cells and sense amplifiers or like circuitry, and sense amplifiers themselves for sensing (and/or latching) signals output from the selected cells during data retrieval (read) operations and for driving signals back to the selected cells during write or refresh operations. For purposes of clarity and definitiveness, atomic memory devices are presented in embodiments below as having a DRAM core and occasionally referred to as atomic DRAMs. In all such embodiments, data storage technologies other than DRAM may be used in accordance with the innovations and improvements disclosed herein, with commensurate changes in the memory core 105, core access circuitry 107, atomic memory controller 101 and interconnection topology.

Continuing with the exemplary atomic memory device 103 shown in FIG. 1A, core access circuitry 107 includes control logic circuitry 109 coupled to receive command and address information via the command/address path 110 (which may be formed by separate command and address paths, or by a single signaling path that is time-multiplexed with command and address information) and data input/output (I/O) circuitry 115 to manage data transfer between the memory core 105 and the external data path (i.e., memory data path 112). The control logic circuitry 109 ("control logic" for short) responds to incoming commands and addresses by controlling operation of the memory core 105 (initiating row and column decoding operations, sense operations, refresh operations, precharge operations, programming operations, erase operations, etc.) and also controlling operation of the data I/O circuitry 115. In particular, the control logic circuitry 109 may manage the timing of data reception during memory write operations (and atomic memory operations that involve data storage), enabling the data I/O circuitry to begin data sampling incoming data (e.g., write data, swap data and/or operand data as discussed below) from the external data path at a predetermined time with respect to registration of a corresponding memory command and to latch the incoming data in one or more registers or buffers that form an interface to the memory core 105. Similarly, control logic 109 may manage the timing of data transmission during memory read operations, enabling the data I/O circuitry 115 to begin unloading read data from the memory core interface and outputting the read data onto the external data path at a predetermined time with respect to registration of a memory read command (or a command to perform an atomic operation that returns data to the host requestor). Though not specifically shown, various timing signals including clock and/or strobe signals (i.e., signals that transition to indicate the presence of valid data) may be received or generated within the atomic memory device 103 and used to coordinate data sampling, transmission operations as well as internal operations within the control logic 109, data I/O circuitry 115 and/or memory core.

In contrast to conventional memory devices, the atomic memory device 103 includes circuitry to execute the above-described data modification operations concurrently with data retrieval. More specifically, the control logic 109 includes circuitry that responds to atomic operation commands (i.e., commands to execute specified atomic operations) as well as non-atomic memory read and write commands (and row activation commands, precharge commands, refresh commands, program commands, erase commands, and so forth as necessary to manage the underlying memory technology). Further, as shown in FIG. 1A, the data I/O circuitry 115 includes modify logic circuitry 117 ("modify logic" for short) to enable modification and write-back of retrieved data as it is en route to its external destination, if any. In one embodiment, for example, the modify logic 117 is coupled between internal serial data lines 131, 133 used to convey outgoing (read) and incoming (write) data between data I/O sampler and driver circuits (121 and 123, respectively) and the memory core interface. As retrieved data is shifted bit by bit onto the outgoing serial data line 133 (i.e., away from the memory core 105), the serial data bits may be received within and operated upon by the modify logic 117 in accordance with a specified modify-operation 128 to produce modified data which is, in turn, shifted bit by bit onto the incoming serial data line 131 (i.e., toward the memory core) and thus written back to the memory core 105. Because the overall data modification and write-back time may be completely or at least substantially hidden under the data retrieval time itself (e.g., within the column access time or column access cycle time of a memory device), the inherent timing restrictions imposed by the memory core technology serve to prevent undesired access to the modified data prior to its storage within the memory core 105 (including storage within the sense amp bank of the memory core, if not within the more remote storage cells themselves) and thus ensure coherency without need for coherency mechanisms within the host requestor or memory controller. That is to say, a data read and write (e.g., read-modify-write) operation performed in the memory device is performed within the input-output path in a manner that it (a) is performed far more quickly than lock mechanisms (where a memory lock is established through software or hardware during processing by a remote controller) and (b) cannot be interfered with by another incoming operation. Returning to the hypothetical illustration presented above, relating to a financial account entry, the memory device may employ a single read-modify-write operation such that an operation to write an updated value into memory (e.g., $120) can be performed in a single command, such updates can never be commenced for data that is stale.

FIGS. 1B-1F illustrates the flow of data in a number atomic memory operations supported by the atomic memory device 103 and atomic memory controller 101 of FIG. 1A. Exemplary operations that can be performed include operations that combine a data access with one or more logical operations, for example, increment operations, decrement operations, inversion, shift and similar operations. Other operations may combine multiple memory access operations, such as for example a swap operation where data in one memory location is swapped with data from another memory location or with data provided by a memory command.

Starting with FIG. 1B, in a read/modify operation, data is retrieved as part of a memory read operation, modified within the modify logic 117 in accordance with a modify-operation 128 ("op") specified by the control logic (and thus by the atomic command from the atomic memory controller) and written back to the memory core 105 in place of the retrieved data.

In FIG. 1C, a similar atomic operation is performed except that, instead of a unary operation in which the read data constitutes the sole operand, a binary (two-operand) operation is performed in accordance with the specified modify-operation 128 using the read data as a primary operand and an internally or externally sourced data value (shown in FIG. 1C as "operand" 140) as the secondary operand. As discussed below, such a sourced operand may be a value previously retrieved from the memory core 105 and stored within an operand register, a value stored within an operand register as part of a memory-controller-instructed register-write operation, a carry-bit from another memory device (e.g., from an adjacent rank) or any other operand data source. An externally-sourced operand (e.g., a value to be loaded into an operand) may be provided, for example, via the external data path (i.e., memory data path 112 of FIG. 1A) in generally the same manner (though not necessarily the same command-relative timing) as write data. Alternatively, an externally-sourced operand may be provided via the command/address path (e.g., time-multiplexed with other information transmitted thereon) or any other signaling connection to the atomic memory device (e.g., an out-of-band transmission channel such as common mode signaling over a differential data link, low-speed signal channel used to initialize the memory system, etc.). As a specific example of an externally-sourced operand, an operand-load instruction and operand value may be provided from atomic memory controller 101 to atomic memory device 103 via the C/A and data paths, respectively (or via either path individually, or via any other in-band or out-of-band signaling path). The control logic 109 within the atomic memory device 103 responds to the operand-load instruction by enabling the specified operand register to be loaded with the incoming operand value. In addition to the techniques identified above, a carry-bit or other operand or result of an operation within modify logic 117 may be output from a memory device (or rank) as shown at 141 ("op result") and provided to another memory device or to a memory controller, to indicate overflow/underflow or other results of such operations.

FIG. 1D illustrates an atomic data-exchange or data-swap operation that may be performed within the memory device architecture of FIG. 1A. Although similar to the binary operation shown in FIG. 1C, instead of performing a modification of the read data value, the read data is conditionally or unconditionally swapped with a swap data value ("swap data") via multiplexing circuitry 151. That is, the swap data value is conditionally or unconditionally written back to the memory core 105 in place of the read data, and the swap data may also be conditionally or unconditionally returned to the memory controller (and thus the host requestor) to signify the swap result. As with the secondary operand in a binary operation, the swap data value may be internally or externally sourced (i.e., provided by a source within or outside the atomic memory device, respectively). In an unconditional swap, referred to herein simply as a swap operation, the swap data value is written back to the memory core in place of the read data value (i.e., overwriting the read data value) while the read data value is returned to the memory controller (and thus to the host requestor). In a conditional swap, modify logic 117 evaluates the read data and/or swap data and conditionally exchanges (swaps) the read data and swap data depending on the evaluation result. As an example, in a particular form of conditional swap referred to herein as a compare-and-swap, the modify logic compares the swap data and read data to determine which is more superlative (greater than, less than, higher magnitude, more '1' or more '0' bits, etc.), writing the swap data back to memory core 105 only if it is the more superlative value. Alternatively (or in response to a different type of conditional swap command), the read data alone or the swap data alone may be evaluated (or may be evaluated with respect to a register-sourced condition or compare value as shown by dashed arrow 142 in FIG. 1D) to determine whether the exchange condition is satisfied (e.g., determining whether a predetermined characteristic of the read data or swap data is met (e.g., more '1's than '0's) or whether read data or swap data exceeds (in any sense) the register-sourced compare value). Whichever data evaluation is performed, if the swap condition is satisfied, the read data may be returned to the swap-data source (e.g., internal register or memory controller) with or without also writing back the read data to memory core 105 (e.g., if no data change will occur, write-back may be suppressed or otherwise omitted) and, conversely, if a swap does occur (i.e., exchange-condition satisfied), the swap data may be returned to the swap-data source. Alternatively, or as part of a different conditional swap command, the read data may be returned regardless of whether the exchange condition is satisfied.

Still referring to FIG. 1D, in a more general conditional operation, the read data may be conditionally modified according to an evaluation of the read data, externally sourced data and/or internally-sourced (e.g., register-supplied) data, with the conditionally modified data written back to the memory core 105 and/or returned to the host requestor. Also, a combination of conditional modification and conditional swap may be carried out. As an example of a unary conditional operation, a read data value may be evaluated to determine whether it has more '0' bits than '1' bits (or vice-versa) and, if so, complemented by the modify logic to generate, as a modified data value, an inverted read data value that is written back to the memory core (and optionally transmitted back to the operation requestor). As an example of a binary conditional operation, the read data value may be compared with an externally sourced data value, with the more superlative value (read data value or externally sourced value) modified in some way (e.g., incrementing a counter field within the more superlative value to indicate the number of comparisons the more superlative value has won) before writing the more superlative value back to the memory core 105. More generally, virtually any useful conditional exchange and/or conditional modification may be executed within the modify logic 117 with optional return of the original, modified and/or superlative data to the memory core or to the memory controller.

FIG. 1E illustrates a special case of a modification operation in which the modified data is returned to the memory controller instead of the read data value. As discussed, the read data value may be absolutely (i.e., in all cases) modified or conditionally modified within the modify logic 117.

FIG. 1F illustrates another special case in which the read data is not returned to the memory controller in either its original or modified form, while the data modified or conditionally modified by modify logic 117 is written back to the memory core 105.

Reflecting on the atomic operations described in reference to FIGS. 1B-1F, it can be seen that each generally involves bi-directional data transfer with respect to the memory core 105 (including conditional bi-directional transfer as the write-back may be conditionally omitted or suppressed as discussed above). Accordingly, such operations are occasionally referred to herein as "duplex" operations to distinguish them from "simplex" operations in which data flow is uni-directional with respect to the memory core. While such duplex operations may be implemented with any underlying memory technology as discussed above, in memory technologies that exhibit a relatively long write latency (e.g., NAND-based flash memory, in which an entire physical page may be written at once), a number of implementation choices may be provided with regard to duplex operation timing. For example and without limitation, an internal write cache may be provided to buffer data to be written as part of a duplex operation, thereby enabling data write-back to be completed quickly within the write-cache. Transfer from the write-cache to the memory core may then occur over a longer time interval (e.g., as required by the underlying memory technology) and potentially at a later time, after multiple updates to the contents of the write cache.

Examples of simplex operations, which are also supported by the atomic memory device 103, include memory read operations and memory write operations as illustrated in FIGS. 1G and 1H. As shown, operation of the modify logic 117 is disabled (an/or the internal read-data path/write-data path is decoupled from the modify logic 117 as indicated by the 'X') so that read data flows uni-directionally from the memory core 105 to the memory controller in a memory read operation (FIG. 1G) and write data flows uni-directionally from the memory controller to the memory core 105 in a memory write operation (FIG. 1H).

In the various embodiments described above, a memory device architecture supporting atomic operations within the device input-output path may receive a superset of commands including both commands for atomic operations as well as more traditional commands, such as those depicted with reference to FIGS. 1G-1H.

FIG. 2 illustrates an embodiment of an atomic memory device 180 in greater detail. As with the generalized atomic memory device of FIG. 1A, atomic memory device 180 includes a memory core 181, control logic circuitry 183 and data I/O circuitry 185. For purposes of explanation only, the memory core 105 is assumed to be a DRAM core having one or more arrays of DRAM cells and corresponding sense amplifier banks 191 that are accessed in response to row and column commands received via command path 214 and corresponding row and column addresses received via address path 216 (the command and address paths collectively forming command/address path 210). Incoming memory access commands are received within a command decoder 197 (e.g., a state machine, sequencer or other decode-and-control circuitry) which issues corresponding control signals to address decoding circuitry and to data I/O circuitry 185 to carry out the requested operation. Upon receiving a row activation command (i.e., command to transfer an address-selected row of data to the sense amp bank), for example, the command decoder 197 asserts a row-decode-enable signal ("rowdec_en") to row decoder 199 to enable the row decoder to decode a row address received via the address path 216 and thereby activate a word line coupled to an address-selected row of cells within the memory core 181. The activated word line enables the contents of the corresponding storage cells (i.e., the storage cells coupled to the word line) to drive respective bit lines (or pairs of bit lines) which are sensed by the bank(s) of sense amplifiers 191. Through this "row activation" operation, the contents of a storage row may be sensed and latched within the sense amplifier bank(s) 191, thus opening a "page" of data that may be accessed via column access (read and write) operations. Accordingly, upon receiving a column access command (i.e., command to read or write a column of data within a previously activated row, and thus a row of data within the sense amplifier bank), the command decoder 197 issues a column-decode-enable signal ("coldec_en") to enable the column decoder 201 (or column multiplexer) to decode a column address received via the address path 216 and, by that operation, form a multiplexed signal conduction path between an address-selected column of data within the sense amplifier bank(s) 191 and a parallel data path referred to herein as the core data path 260.

When an atomic command is received within the command decoder 197, the command decoder issues decode-enable signals in accordance with the atomic operation requested (e.g., column-decode-enable if column data is to be retrieved as part of the atomic operation) and also outputs an operation-select ("opsel") value to one or more modify logic circuits 251 included within the data I/O circuitry 185. The command decoder 197 may additionally output numerous signals and commands to control data sample timing (i.e., data reception), data transmission timing, data buffering, internal data transfer between component circuit blocks, specialized program/erase operation (e.g., in the case of NAND or NOR flash or similar memory), maintenance operations (e.g., self-refresh, auto-refresh, signaling calibration, etc.) or any other control function within the atomic memory device 181. Also, the command decoder 197 may include or enable access to various status registers, control registers and data registers to allow device configurability. In one embodiment, for example, support for atomic operations may be disabled through host-instructed programming of a mode register 218 within the command decoder, thus enabling the atomic memory device to mimic the behavior of legacy memory devices (i.e., in terms of operational timing and/or manner of decoding incoming commands, etc.). As another example, one or more operand registers 216 may be provided to provide operand(s) to the data modify logic 251. In one implementation, for example, a solitary programmable operand register 216 is used to provide operand data to each of the modify logic circuits 251 within the data I/O circuitry 185. In an alternative embodiment, a bank of programmable operand registers 216 are provided, with one or more of the operand registers 216 being selected in accordance with an incoming atomic memory command to provide operand data ("operand") to the modify logic circuits 251. All such mode registers 218 and operand registers 216 may be one-time or run-time programmable. In the case of run-time programmable registers, for example, the mode register 218 may be programmed in response to host instructions (e.g., provided via the memory controller) during system startup to establish an initial operating configuration, and the operand register(s) 216 may be programmed during startup and as needed thereafter to provide operands for use in atomic operations. Values programmed within the mode registers 218 and operand registers 216 may be transferred to the atomic memory device 180 via any or all of the signal paths shown (address 216, command 214, data 212 (DQ)), or via other signaling paths such as low-bandwidth control path, out-of-band signaling channel, etc.).

In one embodiment, the data I/O circuitry 185 includes a number of I/O bit-slice circuits 225 each coupled to a respective data link of the external data path via a pin (or pair of pins in a differential signaling implementation) or other integrated-circuit interconnect. Referring to the detail view of I/O bit-slice circuit 225$_0$ ("I/O slice 225$_0$" for short), the on-chip portion of the incoming data link is coupled to a signal transceiver formed by sampling circuit 231 and output driver 233. In one embodiment, data reception within the sampling circuit 231 is timed by transitions of a receive timing signal (which may be a strobe signal or clock signal received in association with the incoming data signal, or an internally synthesized signal) so that the sampling circuit outputs a serial stream of received data bits onto write-data-in ("wdi") line 232. As shown, the write-data-in line 232 extends into the modify logic 251 where it is coupled to one or more modify units 259 and also to a write-data-out ("wdo") multiplexer 255 (or other signal switching or selection logic). As discussed below, the wdo multiplexer 255 selects either the wdi line 232 or an output of the modify units 259 to drive a serial write-data-out line 234 ("wdo line"), and thus enables passage of write data to the memory core 181 in a simplex write operation, or passage of swap data or modified data to the memory core 181 in a duplex (atomic) operation.

In one embodiment, data to be written to the memory core 181 is converted from serial to parallel form within each of the I/O bit-slices 225, thus enabling the core cycle frequency (e.g., column-access cycle time (column cycle time), core clock cycle, or other cycle time of the memory core 181) to be a fraction of the data I/O frequency. That is, a deserializing circuit 241 ("deser") is provided at the interface between the core data path 261 and the data I/O circuitry 185 to convert serial data conveyed on the wdo line 234 to parallel data for conveyance on core data path 260 and storage within memory core 181. In the particular implementation of FIG. 2, for example, serial data on the wdo line 234 is shifted bit by bit into deserializer 241 at the data I/O frequency (i.e., 1/(bit-time on data path)) and then framed and transferred out of the deserializer and onto core data path 260 at a word rate (e.g., the ratio of serial data frequency to core frequency), e.g., ⅛ or 1/16 the data I/O frequency. For example, after serial shifting of each group of sixteen bits into a shift register of deserializer 241, the core timing signal can be transitioned to transfer the 16-bit data slice within the shift register, in parallel, onto core data path 260. In the exemplary embodiment of FIG. 2, the atomic memory device 180 has a 32-bit wide data interface (i.e., to interface to a 32-bit wide external data path) and enables operation of all the I/O bit slice circuits 225$_0$-225$_{31}$ simultaneously (i.e., each circuit receives data in parallel) so that a core data word formed by a total of 32*16=512 bits is transferred from the data I/O circuitry 185 to the core data path 260 at the conclusion of each core framing interval (core cycle) as marked by a transition of the core timing signal. The core data word is conveyed via the column decoder circuitry 201 to the appropriate 512 bit column of sense amplifiers within sense amplifier bank(s) 191, overwriting the contents therein to complete a column write operation. Thereafter, after some number of memory write/read operations directed to the open page of data (i.e., contents of a storage row present in the sense amplifiers) is completed, a precharge operation may be carried out to close the open page. That is, if the page of data within the sense amplifier bank(s) 191 (which may include thousands or more 512-bit columns) has not already been written back to the corresponding row of storage cells, write-back to the storage cells is completed, the corresponding word line deactivated, and the bit lines and sense amplifiers conditioned in preparation for the next row activation operation.

Still referring to FIG. 2, data flow in a simplex memory read operation is essentially the reverse of that described above in connection with a simplex memory write. That is, an address-selected column of data is output from the memory core 181 (i.e., from sense amplifier bank(s) 191 in a DRAM embodiment) to the core data path 260 via the column decoder 201. Serializers 243 ("ser") within respective I/O bit slice circuits 225 then operate in reverse-manner to the deserializers 241 described above, each converting a respective parallel set of 16 bits into a corresponding stream of sixteen serial bits that are output onto a read-data-in line 236 (the "rdi" line). The rdi line 236 is coupled to the modify units 259 within the modify logic 251 and to a read-data-out ("rdo") multiplexer 257. The rdo multiplexer 257 also receives a data output from the modify units 259 and operates in response to a control signal to pass either the serial data stream supplied via the rdi line 236 (i.e., the "retrieved data" or "read data") or modified data from the modify units 259 to a read-data-out line 238 (the "rdo" line). The rdo line 238 conveys the serial stream of retrieved or modified data to output driver 233 which drives the data serially onto a respective one of the signaling links of the external data path 212.

Still referring to FIG. 2, the above-described relationship between the data I/O frequency and core cycle interval is shown at 262 and 264. That is, during each core cycle interval in which data is being written into and/or retrieved from the memory core 181, sixteen data bits are transmitted serially via the wdo line 234 and/or the rdi line 236. During that same core cycle interval (though potentially offset to account for transfer delays within various circuits of the data I/O circuitry and/or core memory), a 512-bit core data word is transferred between the memory core and the core interface.

Reflecting on the atomic memory of FIG. 2, it should be noted that the specific numbers of bits, bit ratios, frequency ratios and so forth are provided for purposes of example only. In all such cases, different numbers of bits and ratios may apply. Further, while specific circuit blocks have been shown, numerous other circuit blocks may also be provided (and the functions of the circuit blocks shown and described organized differently with regard to such other circuit blocks) without departing from the scope of the present disclosure.

Figure 3:
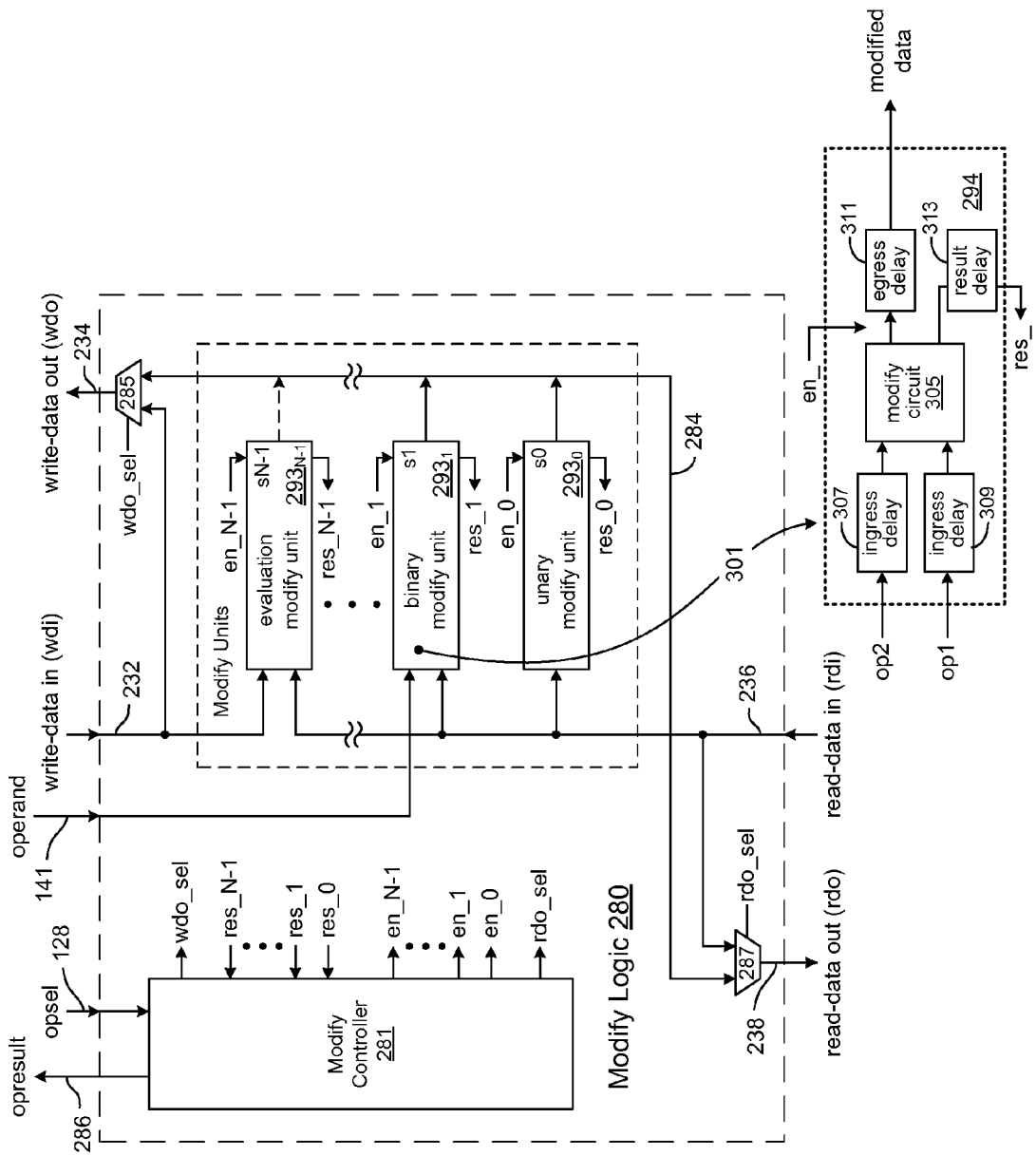
FIG. 3 illustrates an embodiment of a modify logic circuit that may be used to implement the modify logic shown in FIG. 2.

FIG. 3 illustrates an embodiment of a modify logic circuit 280 that may be used to implement modify logic 251 of FIG. 2. The modify logic circuit 280 includes a modify controller 281, write-data-out (wdo) and read-data-out (rdo) multiplexers 285 and 287, and a set of one or more modify units $293_0$-$293_{N-1}$ (collectively, "293"). The modify controller 281 responds to incoming operation-select signals 128 ("opsel") by issuing multiplexer-control signals, wdo_sel and rdo_sel, to the wdo and rdo multiplexers 285 and 287, respectively, and by asserting enabling one or more modify-enable signals (en_0, en1, . . . , enN-1) to enable corresponding modify units 293 to perform evaluation and/or modification operations. The modify controller 281 may also receive one or more operation-result signals (res_0, res_1, res_N-1) from the modify units 293 and use those results in whole or part in generating the enable signals and multiplexer control signals. For example, in a compare-and-swap operation, one of the modify units 293 may perform a data comparison and provide the comparison result to the modify controller 281 to enable determination of the wdo multiplexer setting (and/or rdo multiplexer setting). Although not specifically shown, the modify controller 281 may be clocked or otherwise advanced between states in response to a clock signal (e.g., operating at the data I/O frequency or a subdivided frequency thereof such as the core clock cycle frequency) and may be implemented by any combination of combinatorial and state management logic. For example, in one embodiment the modify controller 281 is implemented as a finite state machine, though an instruction sequencer or even purely combinatorial implementation may be provided in alternative embodiments. In these embodiments, the modify controller 281 may include sets of parallel logic, one for each slice (i.e., for each modify unit $293_0$-$293_{N-1}$) for processing each slice in parallel.

Each of the modify units 293 or any subset thereof may be coupled to the read-data-in line 236 to enable receipt of retrieved serial data as necessary to carry out the operation specified by opsel signal 128. Each of the modify units 293 or a subset thereof may also be coupled to the write-data-in line 232 to enable receipt of externally received serial data which may be write-data, swap data, an externally sourced operand or any other externally supplied information having useful application within the modify logic 280. The modify units 293 or any subset thereof may be coupled to receive an operand from an operand register via operand path 141 as discussed above. Also, while a solitary operand path 141 is shown, multiple operand paths may be provided to provide multiple operands to a given modify unit 293 and/or to provide respective operands to different modify units. Each of the modify units 293 or any subset thereof may also include a select input (s0, s1, . . . , sN-1) coupled to receive a respective enable signal from the modify controller 281, a result signal output (res_0, res_1, . . . , resN-1) to deliver an operation-result signal to the modify controller 281, and a serial-data-output coupled to a modified-data line 284 to deliver modified data serially thereto. The modified-data line 284 conveys modified data to the wdo multiplexer 285 to enable the modified data to be written back to the memory core, and also to the rdo multiplexer 287 to enable the modified data to be output from the atomic memory device via the external data path, both as discussed above.

Still referring to FIG. 3, any number of modify units 293 may be provided within modify logic 280, each to perform respective modify functions or categories of modify functions. In the particular embodiment shown, modify units representative of three classes of modify-operations are depicted including a unary-operation unit $293_0$, a binary-operation unit $293_1$ and an evaluation-operation unit $293_{N-1}$.

The unary-operation unit $293_0$ demonstrates signal inputs and outputs representative of those used to enable unary operations with respect to data retrieved from the memory core. That is, the rdi line 236 is coupled to deliver the retrieved data to the unary operation unit which, when enabled by the modify controller 281 (i.e., en_0 asserted), carries out a specified unary operation (or unary operation for which the underlying circuitry is specifically designed) including for example and without limitation, increment/decrement, complement, absolute value, multiply or divide by fixed constant, exponent (raise to power), root (square root, cubed root or the like), logarithm, table lookup or any other single-argument function. Any result, res_0, generated as part of the unary operation may be returned to the modify controller 281 and/or stored within the modify unit $293_0$ or elsewhere within the atomic memory device for later use. As an example, a carry bit (i.e., overflow bit) or borrow bit (i.e., underflow bit) may be generated as part of an increment operation or decrement operation and summed with/subtracted from a subsequently retrieved data value to enable the increment/decrement operation to be extended to data values greater than 16 bits (i.e., enabling multiple retrieved data values to be processed as constituent parts of a larger data value).

The binary-operation unit $293_1$ demonstrates signal inputs and outputs representative of those used to enable binary operations with respect to data retrieved from the memory core. In the particular implementation shown, the binary-operation unit receives the retrieved data via rdi line 236 and an operand supplied via wdi line 232 as inputs. As discussed above, an operand may additionally or alternatively be supplied via from one or more operand registers within the atomic memory device via respective operand paths 141. In any case, the binary operation unit $293_1$ carries out a binary operation (or ternary operation, quaternary operation, etc. according to the number of supplied operands) when enabled by the modify controller 281 and outputs resultant modified data onto the modified-data line 284 and, optionally, a result signal (e.g., borrow, carry, etc.) onto the result signal line, res_1. As with the unary-operation unit $293_0$, the binary-operation unit $293_1$ may execute a selected, specified operation (e.g., specified by the modify controller) or an operation for which the underlying circuitry is specifically designed. Examples of the binary operations performed include, for example and without limitation, arithmetic operations (add, subtract, multiply, divide), bit-wise logical operations (e.g., a mask operation), Boolean operations (AND, OR, XOR, . . . ), two-dimensional table lookup, or any other multi-operand functions.

Still referring to FIG. 3, the evaluation-operation unit $293_{N-1}$ may be viewed as a form of unary or binary operation unit (according to the number of operands delivered) but is presented separately to emphasize that at least some operations do not require data output onto the modified-data line 284 (hence the dashed interconnection of unit 293$_{N-1}$ and modified-data line 284). That is, in one embodiment, the evaluation-operation unit performs an evaluation of a retrieved data value alone (unary evaluation) or in combination with data received from an external source and/or one or more operands (binary evaluation) and outputs an evaluation-result signal on result line res_N-1 and/or an evaluation data value (e.g., comparison winner) on modified-data line 284. The result of the evaluation may be signaled to the modify controller 281, for example, to enable the modify controller 281 to responsively control the wdo and/or rdo multiplexers 285, 287. As an example, if an evaluation result resolves to "TRUE" (as signaled via res_N-1), then the wdi line 232 can be used to drive wdo line 234, thereby enabling a data swap. Otherwise, if the evaluation result resolves to "FALSE", a write-back operation can be enabled, for example, by passing the retrieved data through the evaluation-operation unit 293$_{N-1}$ to the modified-data line 284 (e.g., as a comparison winner), and setting the wdo multiplexer 285 to couple the modified-data line 284 to the wdo line 234, thereby routing the retrieved data onto the wdo line 234 for write-back to the memory core. An example of the foregoing operation is an operation to swap data only if the incoming value is greater than the resident value in memory.

As an example of a unary evaluation, retrieved data may be evaluated to determine whether a particular Boolean condition is met (e.g., retrieved value evaluates to TRUE or FALSE) or whether the retrieved data otherwise meets a predetermined condition, with data exchange or other modify operations being performed with respect to the same retrieved data value or a subsequently retrieved data value according to the evaluation result. For example, one conditional-increment function may increment data only if not at a maximum (e.g., either a defined maximum of data or an increment that avoids an overflow). In a binary evaluation, the retrieved data value may be compared with the incoming operand data (i.e., from register and/or external source) to generate an operation result (e.g., inequality, match, logical combination of retrieved value and operand satisfy a predetermined or register-specified condition, etc.), with the operation result again being used to enable conditional data exchange or other modify operations with respect to the retrieved data value or a subsequently retrieved data value.

As shown in detail view 301, each of the modify units 293 may be implemented by a modify circuit 305 and one or more delay circuits, 307, 309, 311. The modify circuit 305 may include any combinatorial or state-based logic for generating an operation result and modified data in response to an enable signal (which may be a multi-bit signal to instruct operation of one of multiple possible operations supported by the modify circuit 305). In general, such logic may be synthesized using circuit design tools by specifying the operation to be performed (and thus the operation result and the modified data output) with respect to the incoming retrieved data and any operands. The delay circuits 307, 309, 311 may include hardwired or adjustable delay circuits (e.g., in response to a register-programmed value, or a dynamic value provide in connection with the operation-selection value) to delay propagation of any or all incoming operands (ingress delay circuits 307, 309) to the inputs of the modify circuit 305, and/or to delay propagation of the modified data to the modified-data line 284 (egress delay circuit 311) and/or to delay output of the operation result (result delay circuit 313) to the modify controller. By this arrangement, incoming operands may be provided to the modify circuit 305 at an appropriate time or the modified data or an operation-result may be driven at a desired time, thus enabling coordination of various events within and external to the modify logic 280 as well as pipelining of atomic operations. A designer may utilize these features so as to tailor (e.g., optimize) traffic flow through the input-output path of the memory device for the atomic operations supported for the particular design.

FIG. 4 illustrates a table of operations (340) that may be initiated and controlled by the modify controller of FIG. 3 in accordance with the operation specified by the command decoder or other control circuitry within the atomic memory device. Starting with simplex memory read and simplex memory write operations shown in the first two rows of table 340, because no data is being conditionally or absolutely transmitted in a direction counter to the simplex data flow, no modify unit is enabled. Instead, the modify controller sets the rdo multiplexer to forward the retrieved data ("read data") onto the read-data-out line in a simplex memory read operation, and sets the rdi multiplexer to forward the incoming write data onto the write-data-out line in a simplex memory write operation. Although only two simplex data operations are shown, other simplex operations may be performed, including masked write, masked read, etc.

Turning to the duplex (atomic) operations listed in table 340, in a read/increment operation, the modify controller enables a unary modify unit to carry out an increment operation with respect to data retrieved from the memory core (the "read data), and sets the rdo and wdo multiplexers to output the read data from the atomic memory device and to deliver the modified data output from the enabled modify unit (i.e., the incremented read data in this example) to the memory core to be stored in place of the just-retrieved read data. Thus, a memory read is performed concurrently with incrementing the read data value, returning the read data to the host requestor concurrently (i.e., at least partly overlapping in time) with writing the incremented read data back to the memory core. The increment/read operation is similar (i.e., unary modify unit also selected), except that the modified (incremented) data is both written back to the memory core and returned to the host requester.

Other examples of unary operations specifically shown in table 340 include read/complement (read a data value and overwrite it with its complement (inverted data value)) and complement/read (overwrite the read data value with its complement and return the complement value to the host). In all such cases, the write-back to the memory core may be conditioned on evaluation of the retrieved data and/or one or more operands. A 1's complement operation may also be used (as opposed to a straight complement). As should be apparent, although not specifically listed in table 340, numerous other unary operations may be performed as discussed above.

Turning to examples of binary duplex operations that reference register-sourced operands, in a read/add-offset operation, the offset value within a register is added to a retrieved data value to establish a variable+constant result that may be unconditionally or conditionally written back to the memory core. More specifically, a binary-operation unit that performs the data+operand operation is enabled by the modify controller, and the rdo and wdo multiplexers are set to pass the retrieved data value to the rdo line and the modified data value to the wdo line, respectively. In an add-offset/read operation, similar results are obtained, but the modified data value (retrieved data value plus operand) is returned to the host requestor instead of the read data value. Read/subtract-offset and subtract-offset/read operations are presented as additional examples of binary, register-based operations. Though not specifically listed in table 340, numerous other register-based binary operations may be performed.

The last set of exemplary operations presented in table 340 are binary operations that involve a host-supplied operand, that is, binary duplex operations in which an externally-sourced operand delivered via the wdi line is supplied to a modify unit together with a retrieved data value. The specific examples presented include swap, compare-and-swap, read/add-variable, and add-variable/read. In the swap operation, no modify unit need be enabled (as signified by the "N/A" or not-applicable designation) and instead the modify controller sets the rdo and wdo multiplexers to output the read data to the host requestor and to deliver the swap data to the memory core to overwrite the just-retrieved read data (thus effecting a swap operation). A compare-and-swap operation is carried out similarly, except that the modify controller enables a compare operation within an evaluation-operation unit, and then sets the rdo and wdo multiplexers in accordance with the compare result. In the embodiment shown, for example, the wdo multiplexer may deliver either the swap data or read data onto the wdo line (alternatively, no data may be driven onto the wdo line if the swap data is not to be written back to the memory core) and conversely deliver either the read data or the swap data onto the rdo line according to the comparison result. That is, if a swap is to be executed, the swap data is delivered to the memory core and the read data is returned to the host requestor. If a swap is not to be executed, the read data is delivered to the memory core (or no write back is executed) and the swap data is optionally returned to the memory requestor to enable the memory requestor to ascertain the comparison result.

Turning to the read/add-variable operation, retrieved data is returned to the host requestor and also added to an externally-supplied operand to generate a sum that is written back, as a modified data value, to the memory core. In the case of an add-variable/read operation, the sum is both written back to the memory core and returned to the host requestor. Again, though not specifically listed in table 340, numerous other binary operations that involve host-supplied operands may be performed. Also, as described above, all such arithmetic operations, regardless of their operand source, may be extended to enable operation with respect to multiple retrieved data values through borrow or carry storage or other state information as appropriate for the operation performed.

Figure 5:
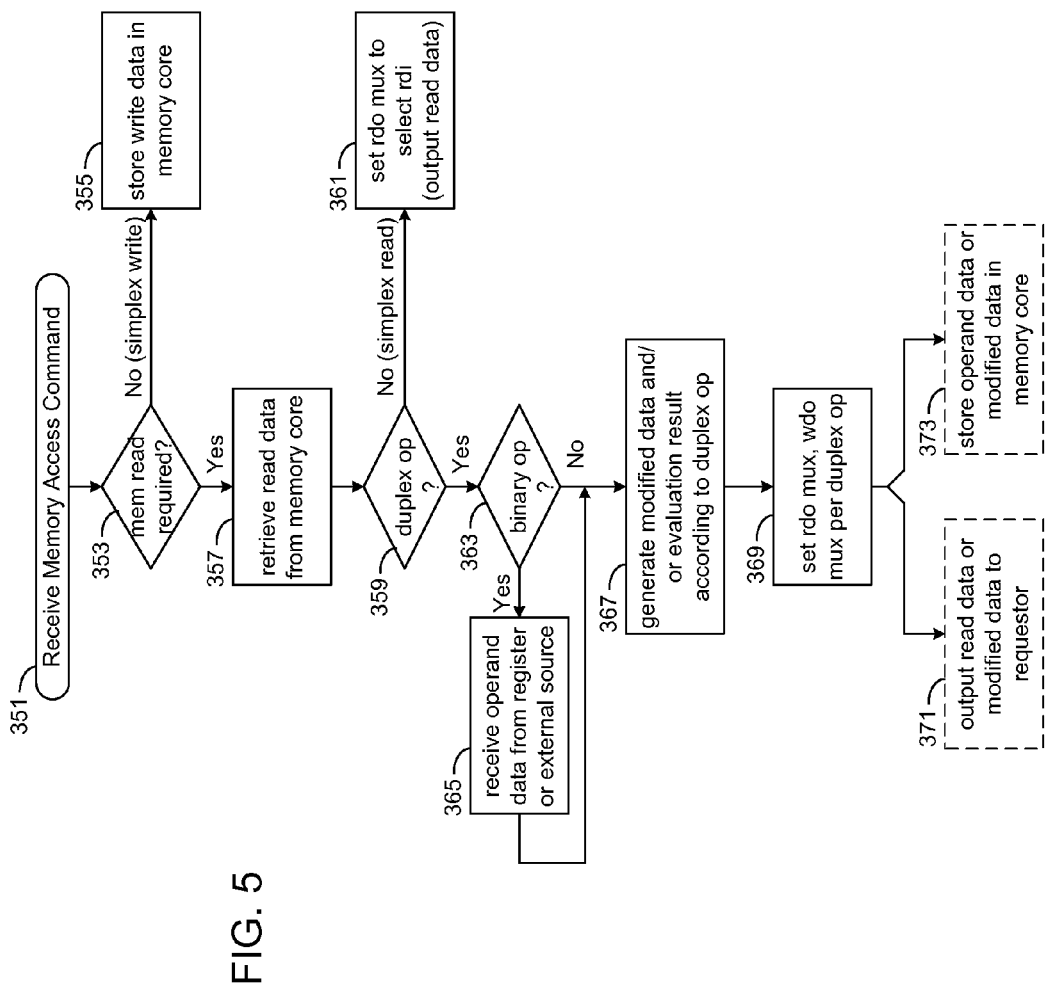
FIG. 5 illustrates a generalized and exemplary operation of an atomic memory device in response to receipt of a memory access command.

FIG. 5 illustrates a generalized and exemplary operation of an atomic memory device in response to receipt of a memory access command as shown at 351. If no memory read is required (determined in decision block 353), then the requested memory access is a simplex write. Accordingly, the incoming write data value is stored in the memory core as shown at 355. If a memory read is required, then read data is retrieved from the memory core in an operation shown generally at 357. If the memory access command indicates a duplex operation (i.e., data flowing both into and out of the memory core in response to the memory access command), then execution proceeds to decision block 359. Otherwise, the memory access command is simplex read command, and the read-data-out multiplexer is set to select the read-data-in line and thus output the read data to the host requestor as shown at 361, thereby completing the simplex operation.

Continuing with the case of a duplex operation (i.e., affirmative determination at block 359), if the atomic command indicates a binary operation (i.e., it is determined at 363 that the operation involves a data source other than the retrieved data value), then the operand is received from a register or external source (e.g., from an operand register or via the write-data-in line) at 365 and supplied to the appropriate modify unit. Thereafter, whether unary operation (negative determination at decision block 363) or binary operation, the appropriate modify unit is selected in accordance with the specified atomic operation and enabled at 367 to generate a modified data value or evaluation result with respect to the retrieved data and any supplied operands. The read-data-out multiplexer and write-data-out multiplexer are set at 369 in accordance with the duplex operation being performed and any evaluation result, thus enabling concurrent output of the read data or modified data to the host requestor at 371 and/or storage of operand data (e.g., swap data) or modified data in the memory core at 373.

Figure 6:
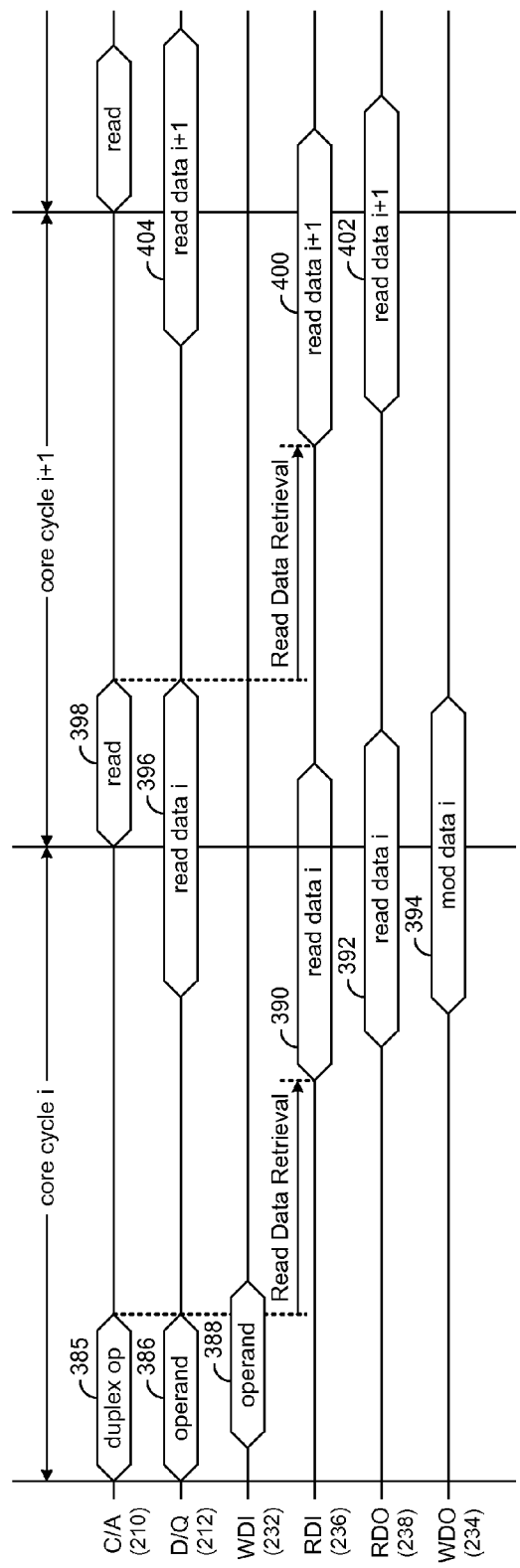
FIG. 6 is a timing diagram illustrating signal timing during an exemplary duplex operation within the atomic memory device of FIG. 3.

FIG. 6 is a timing diagram illustrating signal timing during an exemplary duplex operation within the atomic memory device of FIG. 3. At the start of a core cycle 'i,' a memory access command 385 specifying a duplex (atomic) operation is received via the command/address path 210 (C/A) concurrently with receipt of an operand 386 to be applied within the duplex operation via the external data path 212 (D/Q). After a data sampling delay, the operand is presented on the write-data-in line 232 as shown at 388 and thus to the modify logic of the atomic memory device. Meanwhile, during the interval marked in FIG. 6 as "Read Data Retrieval," read data is retrieved from the memory core in accordance with an address provided in association with the duplex operation, eventually becoming valid and presented to the modify logic on the read-data-in line 236 as shown at 390. Assuming a duplex operation in which read data or modified data (including swap data) is to be returned to the host requestor, the output of the modify logic (read data or modified data or swap data, for example) is output onto the read-data-out line 238 as shown at 392 and, at approximately the same time(or shortly before or after data output onto rdo line 238), modified data (including swap data) is output onto the write-data-out line to 234 be written back to the memory core as shown at 394. Concurrently with write-back to the memory core, data output onto the read-data-out line is driven onto the external data path 212 as shown at 396 and thereby returned to the host requestor during the beginning of the succeeding core cycle (i.e., core cycle i+1). In the particular example shown, a simplex memory read operation is commanded at the start of core cycle i+1 (i.e., as shown at 398), with the data retrieval operation being carried out with essentially the same timing as the data retrieval in the preceding duplex operation. That is, read data i+1 becomes available on the rdi line as shown at 400 (i.e., after the Read Data Retrieval interval), and is routed onto the rdo line shortly thereafter as shown at 402. Read data i+1 is then output onto the external data path as shown at 404, thus completing the simplex memory read just as another read operation is received in the ensuing core cycle.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages.

Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Signals and signaling paths shown or described as being single-ended may also be differential, and vice-versa. A signal driving circuit is said to "output" a signal to a signal receiving circuit when the signal driving circuit asserts (or deasserts, if explicitly stated or indicated by context) the signal on a signal line coupled between the signal driving and signal receiving circuits. The expression "timing signal" is used herein to refer to a signal that controls the timing of one or more actions within an integrated circuit device and includes clock signals, strobe signals and the like. "Clock signal" is used herein to refer to a periodic timing signal used to coordinate actions between circuits on one or more integrated circuit devices. "Strobe signal" is used herein to refer to a timing signal that transitions to mark the presence of data at the input to a device or circuit being strobed and thus that may exhibit periodicity during a burst data transmission, but otherwise (except for transition away from a parked condition or other limited pre-amble or post-amble transition) remains in a steady-state in the absence of data transmission. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within an integrated-circuit memory chip, the method comprising:
   receiving a memory access command, a column address and a plurality of write data values via one or more of a plurality of signaling links external to the integrated-circuit memory chip;
   in response to the memory access command, decoding the column address to select address-specified sense amplifiers from among a plurality of sense amplifiers that constitute a sense amplifier bank of the integrated-circuit memory chip;
   in response to the memory access command, reading, out of the address-specified sense amplifiers, first data constituted by a plurality of read data values; and
   in response to the memory access command, overwriting the first data within the address-specified sense amplifiers with second data constituted by at least one of the plurality of write data values and by at least one of the plurality of read data values.

2. The method of claim 1 further comprising receiving a plurality of control values via one or more of the plurality of signaling links external to the integrated-circuit memory chip, and wherein overwriting the first data with the second data comprises selecting, as each constituent value of the second data, a respective one of the read data values or write data values based, at least in part, on a respective one of the control values.

3. The method of claim 2 wherein selecting the respective one of the read data values or the write data values as each constituent value of the second data based, at least in part, on a respective one of the control values comprises, selecting as an $N^{th}$ constituent value of the second data either an $N^{th}$ one of the read data values or an $N^{th}$ one of the write data values based, at least in part, on a logic state conveyed by an $N^{th}$ one of the control values, N being an integer.

4. The method of claim 2 wherein receiving the memory access command, column address, plurality of write data values and plurality of control data values via one or more of the plurality of signaling links external to the integrated-circuit memory chip comprises:
   receiving the memory access command and the column address via command/address signaling links external to the integrated-circuit memory chip;
   receiving the plurality of write data values via data signaling links external to the integrated-circuit memory chip; and
   receiving the plurality of control values via external signaling links other than the command/address signaling links and the data signaling links.

5. The method of claim 2 wherein receiving the memory access command, column address, plurality of write data values and plurality of control data values via one or more of the plurality of signaling links external to the integrated-circuit memory chip comprises:
  receiving the memory access command, the column address and the plurality of control values via command/address signaling links external to the integrated-circuit memory chip; and
  receiving the plurality of write data values via data signaling links external to the integrated-circuit memory chip.

6. The method of claim 1 wherein reading the first data out of the address-specified sense amplifiers comprises a read operation and writing the second data back to storage array comprises a write operation, the method further comprising, after the read operation and write operation, writing contents of the sense amplifier bank, including the second data, into an address-specified row of dynamic random access memory (DRAM) cells within a DRAM array of the integrated-circuit memory device.

7. The method of claim 6 wherein receiving the memory access command comprises receiving a column access command that triggers both the read operation and the write operation, the method further comprising:
  prior to reception of the column access command, receiving a row activation command and a row address via one or more of the plurality of signaling links external to the integrated-circuit memory chip; and
  in response to the row activation command:
    decoding the row address to select the address-specified row of DRAM cells; and
    transferring a plurality of columns of data, including a column of data constituted by the first data, from the address-specified row of DRAM cells to the sense amplifier bank.

8. The method of claim 1 wherein receiving the plurality of write data values via one or more of the plurality of signaling links external to the integrated-circuit memory chip comprises receiving the plurality of write data values via a bidirectional data signaling interface coupled to a plurality of external data signaling links, and wherein reading the first data out of the address-specified sense amplifiers and overwriting the first data within the address-specified sense amplifiers with the second data comprises routing the one or more read data values included within the second data away from the address-specified sense amplifiers when reading out the first data and back to the address-specified sense amplifiers when overwriting the first data via logic circuitry coupled between the sense amplifier bank and the bidirectional data signaling interface.

9. The method of claim 1 further comprising receiving one or more timing signals via one or more timing signal links external to the integrated-circuit memory chip and wherein receiving the plurality of write data values via one or more of the plurality of signaling links external to the integrated-circuit memory chip comprises receiving the plurality of write data values synchronously with respect to the one or more timing signals.

10. The method of claim 9 wherein receiving the plurality of write data values synchronously with respect to the one or more timing signals comprises receiving respective portions of the write data values over a sequence of intervals defined by transitions of the one or more timing signals.

11. An integrated-circuit memory chip comprising:
  a memory core including an array of memory cells and a sense amplifier bank;
  one or more signaling interfaces to receive, via one or more of a plurality of signaling links external to the integrated-circuit memory chip, a memory access command, a column address and a plurality of write data values; and
  core access circuitry to carry out a memory access operation with respect to the memory
  core in response to the memory access command, including circuitry to:
    decode the column address in response to the memory access command to select address-specified sense amplifiers from among a plurality of sense amplifiers that constitute the sense amplifier bank;
    read, out of the address-specified sense amplifiers and in response to the memory access command, first data constituted by a plurality of read data values; and
    overwrite the first data within the address-specified column of sense amplifiers with second data in response to the memory access command, the second data constituted by at least one of the plurality of write data values and by at least one of the plurality of read data values.

12. The integrated-circuit memory chip of claim 11 wherein the one or more signaling interfaces comprise a signaling interface to receive a plurality of control values via one or more of the plurality of signaling links external to the integrated-circuit memory chip, and wherein the circuitry to overwrite the first data with the second data comprises circuitry to select, as each constituent value of the second data, a respective one of the read data values or write data values based, at least in part, on a respective one of the control values.

13. The integrated-circuit memory chip of claim 12 wherein the circuitry to select the respective one of the read data values or the write data values as each constituent value of the second data based, at least in part, on a respective one of the control values comprises circuitry to select, as an $N^{th}$ constituent value of the second data, either an $N^{th}$ one of the read data values or an $N^{th}$ one of the write data values based, at least in part, on a logic state conveyed by an $N^{th}$ one of the control values, N being an integer.

14. The integrated-circuit memory chip of claim 12 wherein the one or more signaling interfaces to receive the memory access command, column address, plurality of write data values and plurality of control data values via one or more of the plurality of signaling links external to the integrated-circuit memory chip comprise:
  a first interface to receive the memory access command and the column address via command/address signaling links external to the integrated-circuit memory chip;
  a second interface to receive the plurality of write data values via data signaling links external to the integrated-circuit memory chip; and
  a third interface to receive the plurality of control values via external signaling links other than the command/address signaling links and the data signaling links.

15. The integrated-circuit memory chip of claim 12 wherein the one or more signaling interfaces to receive the memory access command, column address, plurality of write data values and plurality of control data values via one or more of the plurality of signaling links external to the integrated-circuit memory chip comprise:
  a command/address interface to receive the memory access command, the column address and the plurality of control values via command/address signaling links external to the integrated-circuit memory chip; and a data interface to receive the plurality of write data values via data signaling links external to the integrated-circuit memory chip.

16. The integrated-circuit memory chip of claim 11 wherein the circuitry to read the first data out of the address-specified sense amplifiers and write the second data back to storage array comprises circuitry to execute a read operation and a write operation, respectively, the core access circuitry further including circuitry operable, after execution of the read operation and the write operation, to write contents of the sense amplifier bank, including the second data, into an address-specified row of dynamic random access memory (DRAM) cells within the array of memory cells.

17. The integrated-circuit memory chip of claim 16 wherein the one or more signaling interfaces to receive the memory access command comprises a command interface to receive a column access command that triggers both the read operation and the write operation, and to further receive, prior to reception of the column access command, a row activation command and a row address via one or more of the plurality of signaling links external to the integrated-circuit memory chip, and wherein the core access circuitry comprises circuitry responsive to the row activation command to (i) decode the row address to select the address-specified row of DRAM cells; and (ii) transfer a plurality of columns of data, including a column of data constituted by the first data, from the address-specified row of DRAM cells to the sense amplifier bank.

18. The integrated-circuit memory chip of claim 11 wherein the one or more signaling interfaces to receive the plurality of write data values via one or more of the plurality of signaling links external to the integrated-circuit memory chip comprises a bidirectional data signaling interface to receive the plurality of write data values via a plurality of external data signaling links, and wherein the circuitry to read the first data out of the address-specified sense amplifiers and overwrite the first data within the address-specified sense amplifiers with the second data comprises logic circuitry, coupled between the sense amplifier bank and the bidirectional data signaling interface, to route the one or more read data values included within the second data away from the address-specified sense amplifiers when reading out the first data and back to the address-specified sense amplifiers when overwriting the first data.

19. The integrated-circuit memory chip of claim 11 further comprising a timing signal interface to receive one or more timing signals via one or more timing signal links external to the integrated-circuit memory chip and wherein the one or more signaling interfaces to receive the plurality of write data values via one or more of the plurality of signaling links external to the integrated-circuit memory chip comprise a data interface to receive the plurality of write data values synchronously with respect to the one or more timing signals.

20. The integrated-circuit memory chip of claim 19 wherein the data interface to receive the plurality of write data values synchronously with respect to the one or more timing signals comprises circuitry to receive respective portions of the write data values over a sequence of intervals defined by transitions of the one or more timing signals.

21. A non-transitory machine-readable medium that stores data representative of an integrated-circuit memory chip comprising:
a memory core including an array of memory cells and a sense amplifier bank;
one or more signaling interfaces to receive, via one or more of a plurality of signaling links external to the integrated-circuit memory chip, a memory access command, a column address and a plurality of write data values; and
core access circuitry to carry out a memory access operation with respect to the memory core in response to the memory access command, including circuitry to:
decode the column address in response to the memory access command to select address-specified sense amplifiers from among a plurality of sense amplifiers that constitute the sense amplifier bank;
read, out of the address-specified sense amplifiers and in response to the memory access command, first data constituted by a plurality of read data values; and
overwrite the first data within the address-specified sense amplifiers with second data in response to the memory access command, the second data constituted by at least one of the plurality of write data values and by at least one of the plurality of read data values.

* * * * *